(12) United States Patent
Hiroshima et al.

(10) Patent No.: US 7,633,139 B2
(45) Date of Patent: Dec. 15, 2009

(54) SEMICONDUCTOR DIODE DEVICE WITH LATERAL TRANSISTOR

(75) Inventors: Takashi Hiroshima, Gunma (JP); Kazutomo Goshima, Gunma (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 143 days.

(21) Appl. No.: 11/785,254

(22) Filed: Apr. 16, 2007

(65) Prior Publication Data

US 2007/0241426 A1 Oct. 18, 2007

(30) Foreign Application Priority Data

Apr. 18, 2006 (JP) .............................. 2006-114614

(51) Int. Cl.
*H01L 23/62* (2006.01)
(52) U.S. Cl. ............... 257/557; 257/577; 257/E27.023; 257/E27.032; 257/E27.043
(58) Field of Classification Search ................. 257/557, 257/547, 558, 577, E27.023, E27.032, E27.043
See application file for complete search history.

(56) References Cited

U.S. PATENT DOCUMENTS

| 4,117,507 | A | * | 9/1978 | Pacor | 257/547 |
| 5,132,235 | A | * | 7/1992 | Williams et al. | 438/294 |
| 5,272,371 | A | * | 12/1993 | Bishop et al. | 257/362 |
| 5,432,370 | A | * | 7/1995 | Kitamura et al. | 257/339 |
| 6,111,449 | A | * | 8/2000 | Tobita | 327/327 |
| 6,590,264 | B2 | | 7/2003 | Ker et al. | |
| 6,642,599 | B1 | * | 11/2003 | Watabe et al. | 257/509 |
| 7,018,927 | B2 | * | 3/2006 | Lee | 438/700 |
| 7,045,830 | B1 | * | 5/2006 | Cai et al. | 257/139 |
| 2002/0079555 | A1 | * | 6/2002 | Okawa et al. | 257/565 |
| 2004/0080883 | A1 | * | 4/2004 | Chatterjee et al. | 361/56 |
| 2006/0226499 | A1 | * | 10/2006 | Shimizu | 257/409 |

FOREIGN PATENT DOCUMENTS

| JP | 63-205946 | 8/1988 |
| JP | 6-85184 | 3/1994 |
| JP | 2002-198436 | 7/2002 |

* cited by examiner

*Primary Examiner*—Minh-Loan T Tran
(74) *Attorney, Agent, or Firm*—Morrison & Foerster LLP

(57) ABSTRACT

The invention is directed to a semiconductor device having a diode element which prevents a leakage current due to a vertical parasitic bipolar transistor and enhances current efficiency. An element isolation insulation film is provided on an N well layer, and a first $P^+$ layer and a second $P^+$ layer are formed on the N well layer surrounded by the element isolation insulation film, the second $P^+$ layer being formed at a distance from the first $P^+$ layer. An electrode layer is formed on the N well layer between the first $P^+$ layer and the second $P^+$ layer. An $N^+$ layer for a contact is formed on the N well layer between the element isolation insulation film and other element isolation insulation film. The first $P^+$ layer is connected with an anode wiring, and the electrode layer, the second $P^+$ layer, and the $N^+$ layer are connected with a cathode wiring. A diode element utilizing a lateral PNP bipolar transistor is thus formed on the semiconductor substrate.

8 Claims, 8 Drawing Sheets

SEMICONDUCTOR DIODE DEVICE WITH LATERAL TRANSISTOR

CROSS-REFERENCE OF THE INVENTION

This invention claims priority from Japanese Patent Application No. 2006-114614, the content of which is incorporated herein by reference in its entirety.

BACKGROUND OF THE INVENTION

1. Field of the Invention

The invention relates to a semiconductor device, particularly to a diode preventing a parasitic current.

2. Description of the Related Art

Conventionally, a diode element has been generally provided on a semiconductor substrate. A diode is widely used as a simple resistor, a part of a constant-voltage circuit for obtaining a predetermined voltage or the like.

A conventional diode element provided on a semiconductor substrate will be described referring to figures. FIG. 10 is a plan view of the conventional diode element, and FIG. 11 is a cross-sectional view thereof along line X-X. An anode wiring 104 and a cathode wiring 106 in FIG. 11 are omitted in FIG. 10.

An N well layer 101 made of an N-type impurity is formed in a P-type semiconductor substrate 100. Element isolation insulation films 102a, 102b and 102c are formed, so as to define a corresponding square, on a predetermined region of the N well layer 101, on the boundary of the P-type semiconductor substrate 100 and the N well layer 101 and on the P-type semiconductor substrate by the LOCOS (Local Oxidation of Silicon) method or the STI (Shallow Trench Isolation) method.

A P$^+$ layer 103 made of a P-type impurity is formed on the N well layer 101 surrounded by the element isolation insulation film 102a. The P$^+$ layer 103 is connected with an anode electrode Anode through the anode wiring 104, and used as an anode region of the diode element.

An N$^+$ layer 105 for a contact made of an N-type impurity is formed on the N well layer 101 between the element isolation insulation film 102a and the element isolation insulation film 102b. The N$^+$ layer 105 is connected with a cathode electrode Cathode through the cathode wiring 106, and used as a cathode region of the diode element.

A P$^+$ layer 107 made of a P-type impurity is formed on the front surface of the semiconductor substrate 100 on the outside of the element isolation insulation film 102b. The semiconductor substrate 100 is grounded through the P$^+$ layer 107. The relevant technology is described in Japanese Patent Application Publication No. 2002-198436, for example.

However, when a forward voltage is applied to the described diode element to flow a current, as shown in FIG. 11, a vertical parasitic bipolar transistor 110 turns on by the P$^+$ layer 103 serving as an emitter region, the N well layer 101 serving as a base region and the P-type semiconductor substrate 100 serving as a collector region, thereby causing a problem that a leakage current flows into the semiconductor substrate 100. This problem further causes various problems that low current consumption or a desired integrated circuit (e.g. a constant-voltage circuit) is not achievable, or the like.

The invention is directed to a semiconductor device having a diode element which reduces a leakage current to a semiconductor substrate and improves forward current capability.

SUMMARY OF THE INVENTION

The features of the invention are as follows. The invention provides a semiconductor device having a diode element on a semiconductor substrate, including: a first conductive type well layer formed on the semiconductor substrate and connected with a cathode electrode of the diode element; a second conductive type first impurity layer connected with an anode electrode of the diode element and formed in the well layer; and a second conductive type second impurity layer connected with the cathode electrode of the diode element and formed in the well layer at a distance from the first impurity layer, wherein the first impurity layer, the well layer and the second impurity layer form a lateral bipolar transistor.

In the semiconductor device of the invention, an electrode layer is formed on the well layer between the first impurity layer and the second impurity layer with an insulation film interposed therebetween.

The semiconductor device of the invention further includes an element isolation insulation film formed on the well layer between the first impurity layer and the second impurity layer.

In the semiconductor device of the invention, the well layer includes a retrograde type well layer. Here, the retrograde type means that the concentration is increased from the front surface side in the depth direction of the substrate.

DETAILED DESCRIPTION OF THE INVENTION

Figure 1:
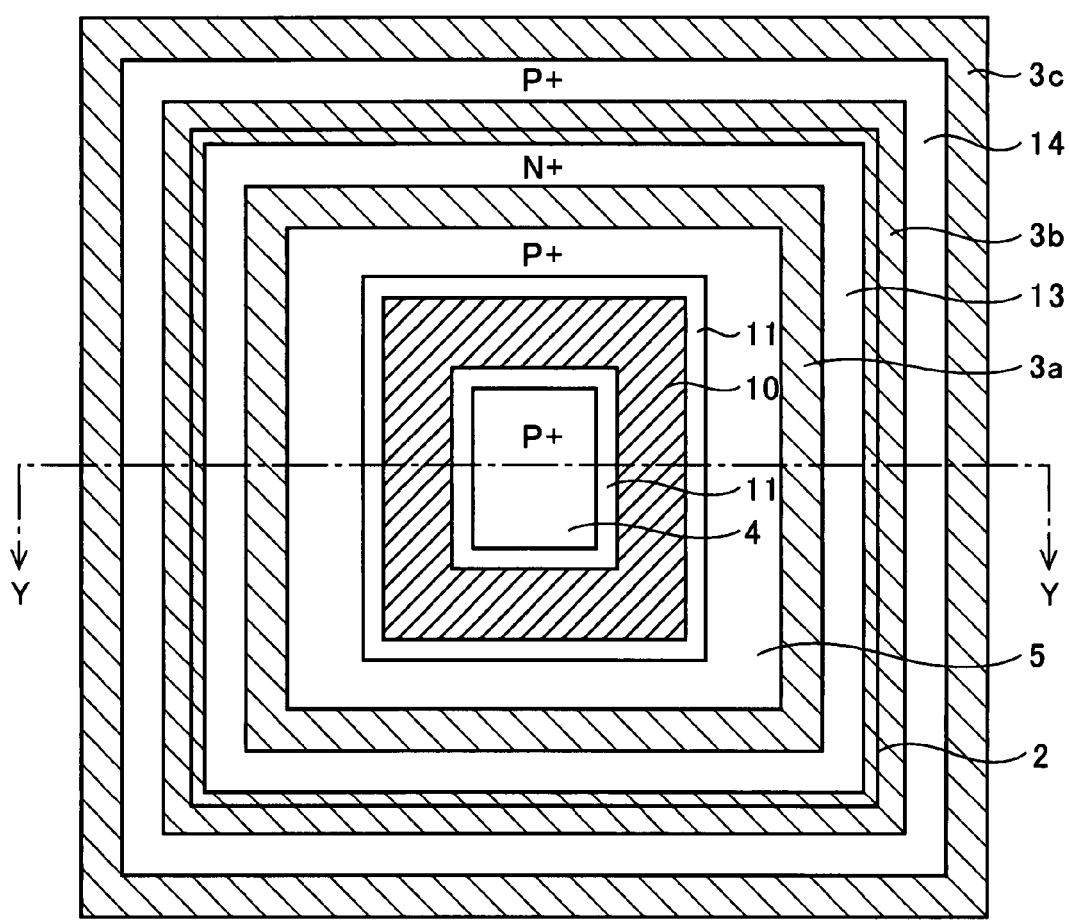
FIG. 1 is a plan view for explaining a semiconductor device of a first embodiment of the invention.
Figure 2:
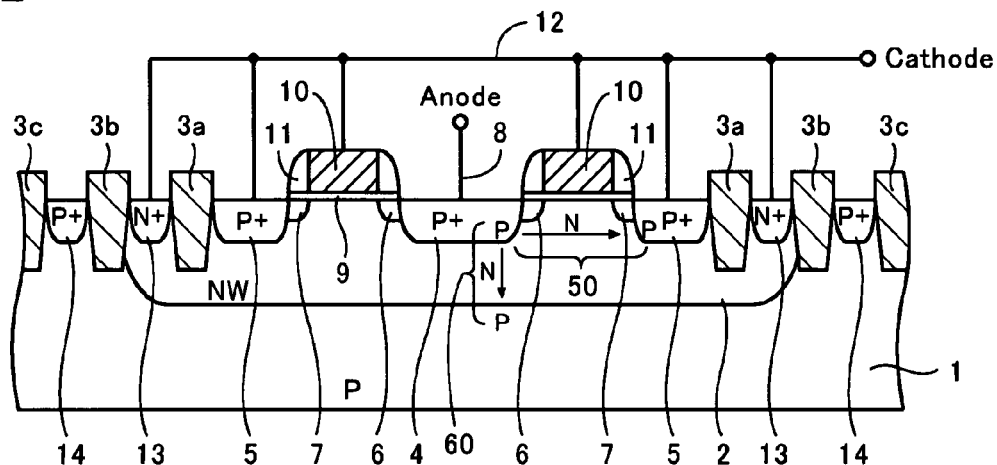
FIG. 2 is a cross-sectional view for explaining the semiconductor device of the first embodiment of the invention.

A first embodiment of the invention will be described referring to figures. FIG. 1 is a plan view showing a structure of a semiconductor device having a diode element of the first embodiment, and FIG. 2 is a cross-sectional view thereof along line Y-Y. An anode wiring 8 and a cathode wiring 12 in FIG. 2 are omitted in FIG. 1.

An N well layer 2 made of an N-type impurity is formed in a P-type semiconductor substrate 1, having a depth of, for example, 1 μm. The N well layer 2 is formed by ion-implanting the N-type impurity, for example, phosphorus (P) on a surface of the P-type semiconductor substrate 1 under the conditions of an acceleration voltage of 1000 KeV and a dose of $5\times10^{12}/cm^2$, an acceleration voltage of 450 KeV and a dose of $5\times10^{12}/cm^2$, and an acceleration voltage of 160 KeV and a dose of $4.5\times10^{12}/cm^2$, in which the concentration is varied in its depth direction. That is, the N well layer 2 of this embodiment is the so-called retrograde type well layer where the concentration is higher in the deeper portion than in the front surface side of the substrate. Although the ion implantation is performed plural times in this embodiment, the ion implantation may be performed once to form the N well layer 2 and the N well layer 2 is not necessarily of the retrograde type in the invention.

It is noted that conductivity types such as P, $P^+$ and $P^-$ belong to one general conductivity type, and conductivity types such as N, $N^+$ and $N^-$ belong to another general conductivity type.

Furthermore, after these ion implantation processes, ion implantation for adjusting a threshold (Vt) may be performed. The ion implantation for adjusting a threshold is performed using arsenic (As) ion under the condition of, for example, an acceleration voltage of 60 KeV and a dose of $2.3\times10^{12}/cm^2$.

Element isolation insulation films 3a, 3b and 3c (e.g. silicon oxide films) are formed on a predetermined region of the N well layer 2, on the boundary of the P-type semiconductor substrate 1 and the N well layer 2, and on the front surface of the semiconductor substrate 1 on the outside of the N well layer 2. The element isolation insulation films 3a, 3b and 3c are formed by the LOCOS method or the STI method which are generally known. Since the STI method provides the narrower isolation width and deeper isolation depth than the LOCOS method, the STI method is preferable from an aspect of larger scale integration and improvement in isolation capability of the semiconductor device. Hereafter, the element isolation insulation film 3a is referred to as a first element isolation insulation film, the element isolation insulation film 3b is referred to as a second element isolation insulation film, and the 3c is referred to as a third element isolation insulation film.

A first $P^+$ layer 4 made of a P-type impurity and a second $P^+$ layer 5 are formed on the N well layer 2 surrounded by the first element isolation insulation film 3a, the second $P^+$ layer 5 being formed at a distance from the first $P^+$ layer 4. The distance is about 0.3 µm, for example. The first and second $P^+$ layers 4 and 5 are formed by ion implantation of boron (B) as a P-type impurity using an electrode layer 10, which will be described below, or a sidewall 11 formed on the sidewall of the electrode layer 10 as a mask under the condition of an acceleration voltage of 10 KeV and a dose of $5\times10^{15}/cm^2$.

Low concentration $P^-$ layers 6 and 7 are formed adjacent to the first and second $P^+$ layers 4 and 5 respectively, thereby forming the so-called LDD (Lightly Doped Drain) structure. These $P^-$ layers 6 and 7 are formed by ion implantation of boron difluoride ($BF_2$) as a P-type impurity using the electrode layer 10, which will be described below, as a mask under the condition of an acceleration voltage of 10 KeV and a dose of $7\times10^{13}/cm^2$. When the LDD structure is not to be formed, this ion implantation is not necessary.

The first $P^+$ layer 4 is electrically connected with an anode electrode (Anode) through the anode wiring 8, and used as an anode region. In this embodiment, the first $P^+$ layer 4 is formed like an island on the N well layer 2.

The second $P^+$ layer 5 is formed to surround the first $P^+$ layer 4 with a distance from the first $P^+$ layer 4. The second $P^+$ layer 5 is connected with a cathode electrode (Cathode) through the cathode wiring 12.

A gate insulation film 9 made of a silicon oxide film or the like is formed on the N well layer 2 between the first $P^+$ layer 4 and the second $P^+$ layer 5, and the electrode layer 10 made of, for example, a polysilicon layer or the like is formed on the N well layer 2 with the gate insulation film 9 interposed therebetween, surrounding the first $P^+$ layer 4. The sidewall 11 is formed on the sidewall of the electrode layer 10. This sidewall 11 is formed by depositing a silicon oxide film or a silicon nitride film by the CVD method and etching back this film, for example.

The electrode layer 10 is connected with the cathode electrode (Cathode) through the cathode wiring 12. The width of the electrode layer 10 is almost the same as the described distance between the first $P^+$ layer 4 and the second $P^+$ layer 5, for example, 0.3 µm.

In this embodiment, a lateral bipolar transistor 50 where the first $P^+$ layer 4 serves as an emitter region, the N well layer 2 serves as a base region and the second $P^+$ layer 5 serves as a collector region is formed. In detail, this base region corresponds to a region of the N well layer 2 between the first $P^+$ layer 4 and the second $P^+$ layer 5.

An $N^+$ layer 13 for a contact made of an N-type impurity is formed on the front surface of the N well layer 2 between the first element isolation insulation film 3a and the second element isolation insulation film 3b. This $N^+$ layer 13 is formed by ion implantation of an N-type impurity, for example, arsenic (As) under the condition of an acceleration voltage of 50 KeV and a dose of $6\times10^{15}/cm^2$. The $N^+$ layer 13 is connected with the cathode electrode through the cathode wiring 12. In this embodiment, a diode is thus formed by a PN junction of the first $P^+$ layer 4 and the N layer (the N well layer 2 and the $N^+$ layer 13).

A third $P^+$ layer 14 made of a P-type impurity is formed on the front surface of the semiconductor substrate 1 between the second element isolation insulation film 3b and the third element isolation insulation film 3c. The semiconductor substrate 1 is grounded through the third $P^+$ layer 14. The $P^+$ layer 14 is formed by the same process as the process for forming the first and second $P^+$ layers 4 and 5.

In the first embodiment, the diode element utilizing the lateral PNP bipolar transistor is formed in this manner.

Next, the current efficiency of the structure of the semiconductor device of the first embodiment (hereafter, referred to as a first structure) will be described with concrete examples. Here, current efficiency=cathode output current (ampere)÷anode input current (ampere)×100. Furthermore, current loss=(anode input current−cathode output current)÷anode input current×100. Furthermore, 1.E−0n[A] of abscissas of graphs of measurement results which will be described below means $1\times10^{-n}$[A]. Agilent 4156C (Agilent Technologies, Inc.) is used for measuring the current efficiency.

Figure 3:
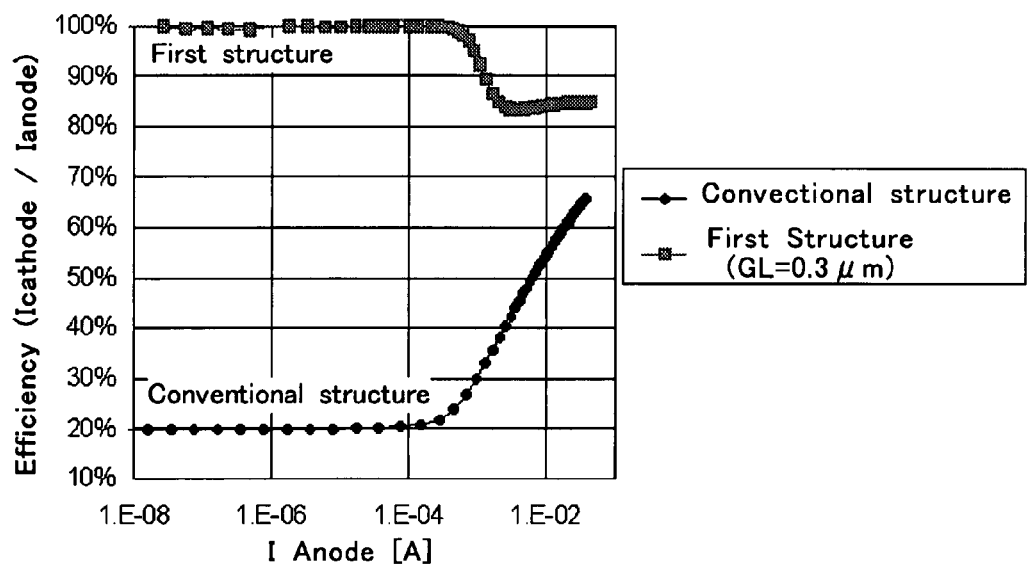
FIGS. 3 to 5B are graphs showing the current efficiency of the semiconductor device of the first embodiment of the invention.
Figure 10:
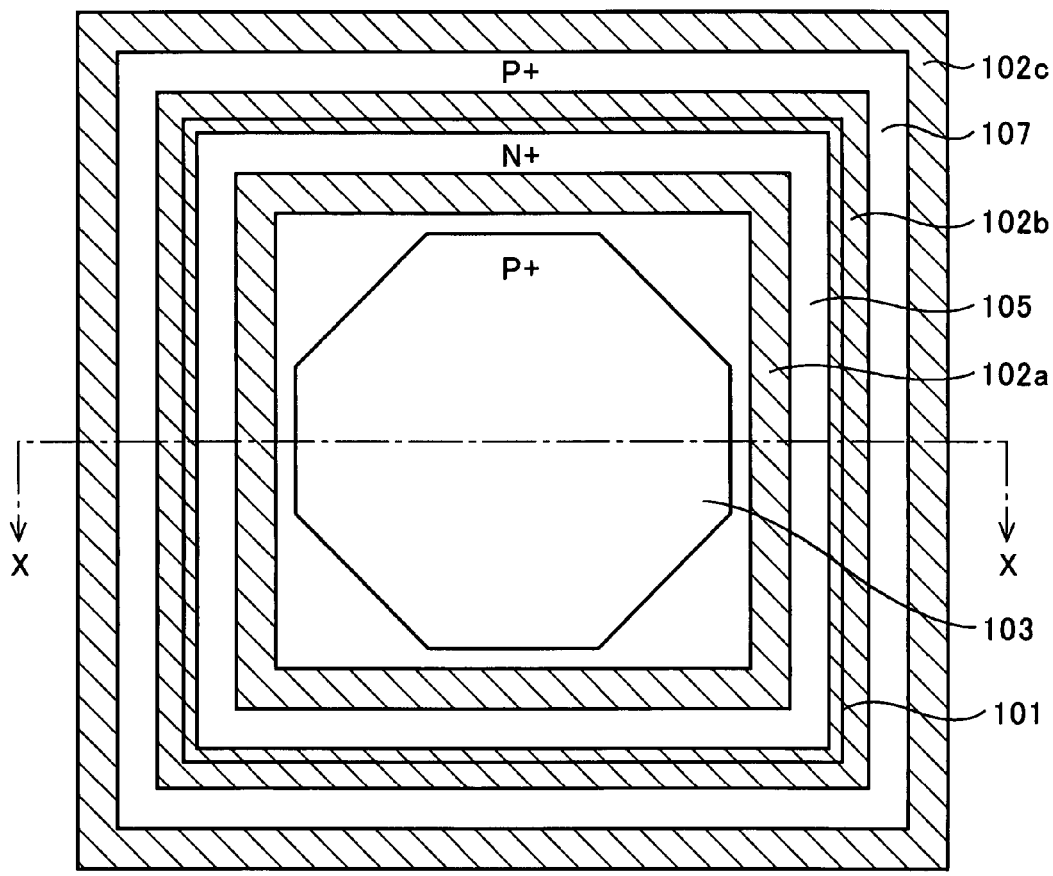
FIG. 10 is a plan view for explaining a conventional semiconductor device.
Figure 11:
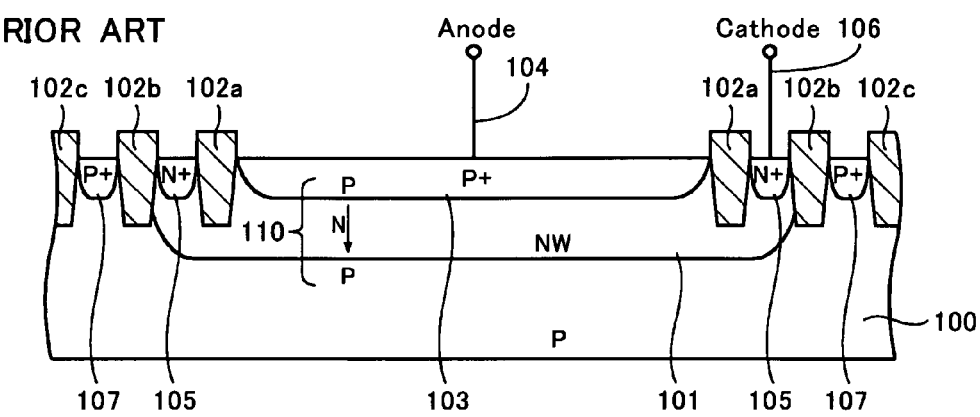
FIG. 11 is a cross-sectional view for explaining the conventional semiconductor device.

In FIG. 3, a line connecting square (■) plots shows the current efficiencies of the first structure where the width (the gate width=GL) of the electrode layer 10 is 0.3 µm when respective anode input currents are flowed therethrough. A line connecting circle (●) plots shows the current efficiencies of the conventional structure shown in FIGS. 10 and 11.

As apparent from this graph, the first structure has the higher current efficiencies than the conventional structure in all the range measured this time (the anode input currents of $1\times10^{-8}$ to $1\times10^{-1}$[A]). Particularly in the range lower than $1\times10^{-8}$[A], while the current efficiency of the conventional structure is about 20%, the current efficiency of the first structure is almost 100% which is prominently higher than that of the conventional structure.

It is considered that the prominently higher current efficiencies of the first structure than those of the conventional structure is due to the lateral bipolar transistor 50 formed in the first structure. In detail, as shown in FIG. 2, the effect of the lateral bipolar transistor 50 in the first structure reduces the effect of a parasitic bipolar transistor 60 and leads a leakage current to the cathode side, which is conventionally flowed into the P-type semiconductor substrate 1 side.

Figure 4A:
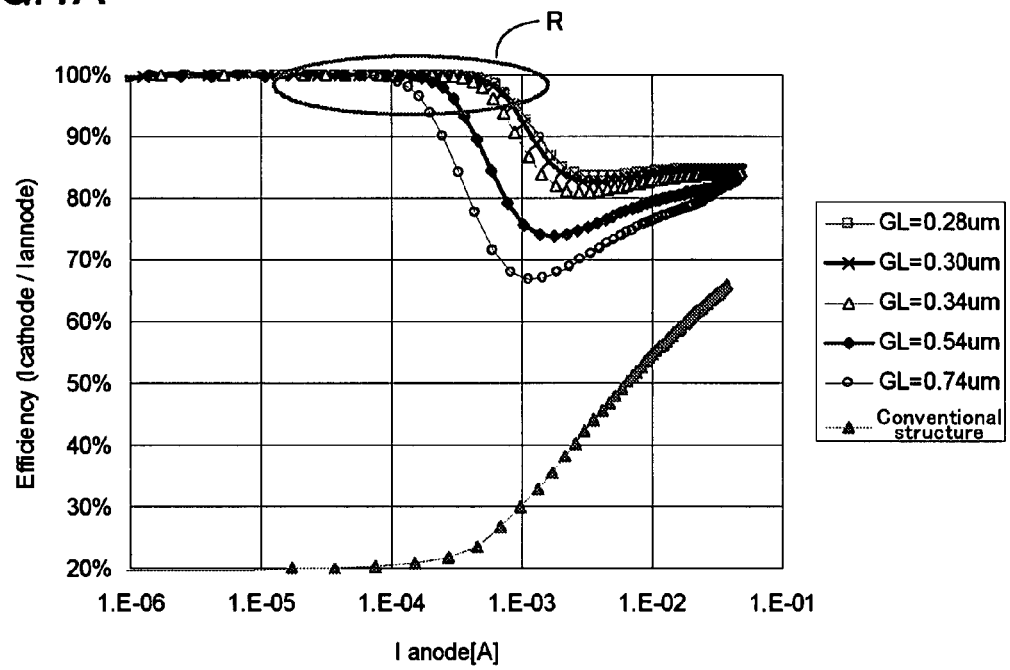
Figure 4B:
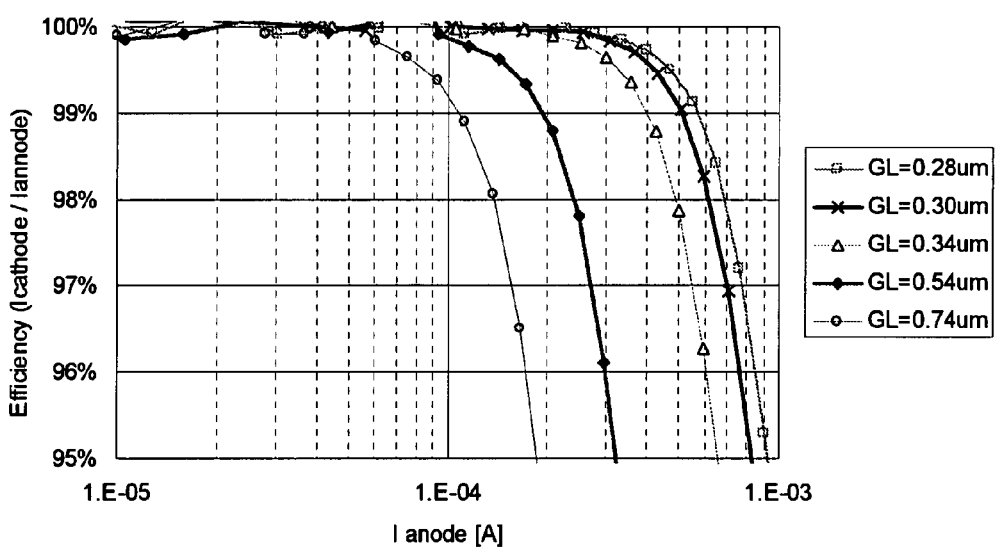

Next, the relation of the current efficiency and the gate width (GL) of the lateral bipolar transistor 50 will be described showing results of measurement in which the width of the electrode layer 10 is changed. FIG. 4 shows the current efficiencies of the first structure where the width (GL) of the electrode layer 10 is set to 0.28 μm, 0.30 μm, 0.34 μm, 0.54 μm, and 0.74 μm and the current efficiencies of the conventional structure. FIG. 4B is a partial enlarged view of a region R in FIG. 4A.

As apparent from FIGS. 4A and 4B, as the width (GL) of the electrode layer 10 is smaller, the current amplification factor of the lateral bipolar transistor 50 is enhanced more and the higher current efficiency is maintained even with the larger anode input current. Therefore, it is preferable to minimize the gate width of the lateral bipolar transistor 50 from an aspect of enhancement of the current efficiency.

As shown in FIGS. 3, 4A, and 4B, as the anode input current is increased in the first structure, the current efficiency gradually reduces from the anode input current of $1\times10^{-4}$(A), and as the anode input current is further increased, the current efficiency gradually increases. In the conventional structure, the current efficiency gradually increases in the range of the anode input current more than $1\times10^{-4}$. The concrete mechanism of these phenomena is not apparent.

Figure 5A:
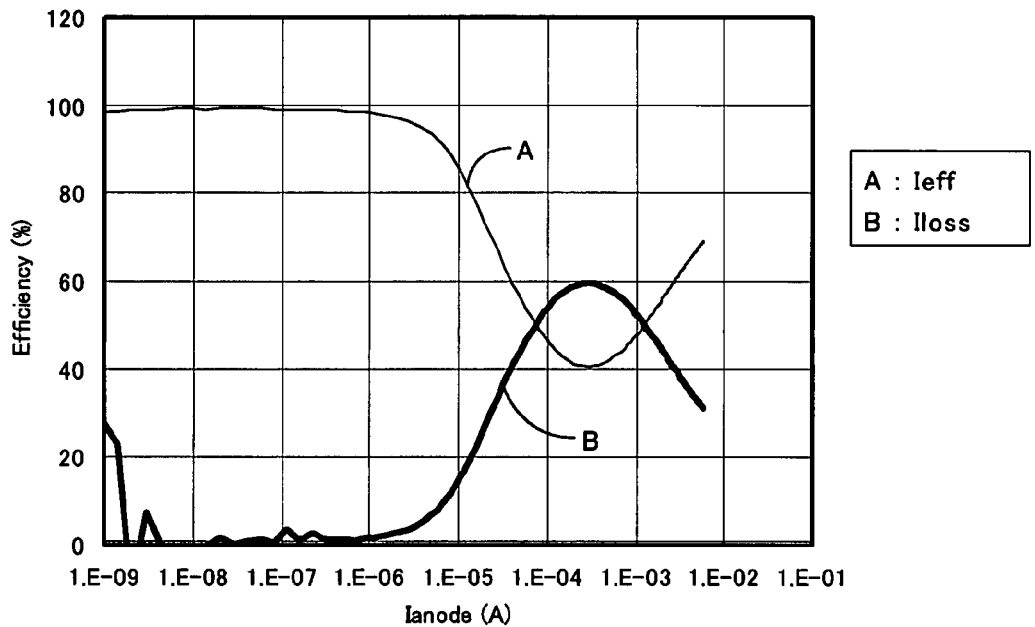
Figure 5B:
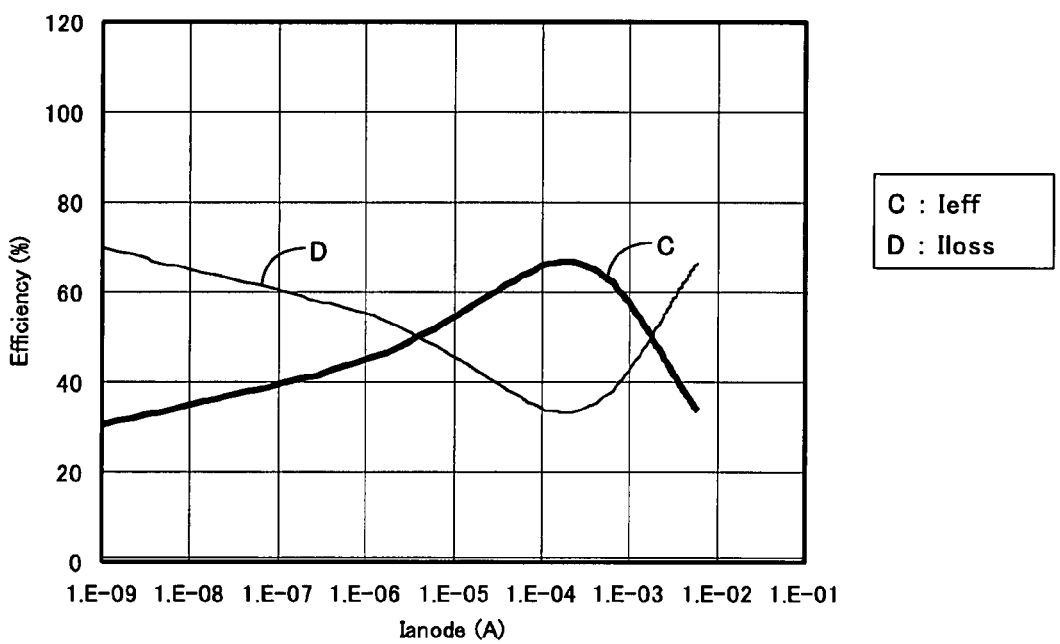

Next, the current efficiencies when the electrode layer is connected with the cathode wiring (hereafter, referred to as cathode-connection) and the current efficiencies when the electrode layer is connected with the anode wiring (hereafter, referred to as anode-connection) will be described. FIG. 5A shows current efficiencies (A) and current losses (B) when the electrode layer of the same structure as the first structure is cathode-connected, and FIG. 5B shows current efficiencies (C) and current losses (D) when the electrode layer of the same device as above is anode-connected.

It is apparent from these measurement results that the cathode connection provides the higher current efficiency than the anode connection. The reason that the anode connection provides the lower current efficiency than the cathode connection is that the anode connection causes electrons to be concentrated in a region under the electrode layer in an accumulation state and lowers the current amplification factor (hFE) of the lateral bipolar transistor 50. Therefore, from the aspect of the enhancement of the current efficiency, it is preferable to connect the electrode layer to the cathode like in this embodiment. It is noted that both the connection cases provide the higher current efficiency than the conventional structure.

Furthermore, from the aspect of the enhancement of the current efficiency, it is preferable to form the retrograde type structure where the concentration of the N well layer 2 gradually increases from the front surface side in its depth direction. With this structure, the front surface side of the substrate provides the higher current amplification factor than the deeper portion thereof. Therefore, the current amplification factor of the lateral bipolar transistor 50 is enhanced, while the current amplification factor of the parasitic bipolar transistor 60 is reduced.

Figure 6:
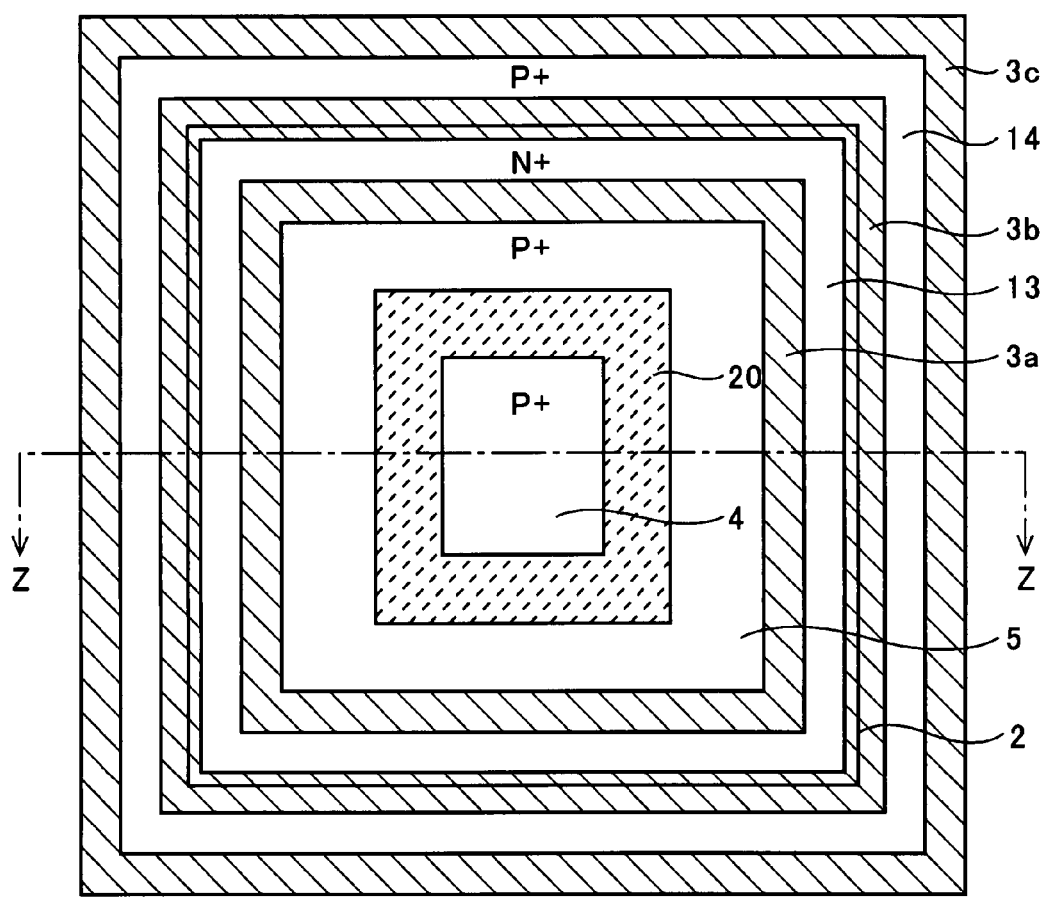
FIG. 6 is a plan view for explaining a semiconductor device of a second embodiment of the invention.
Figure 7:
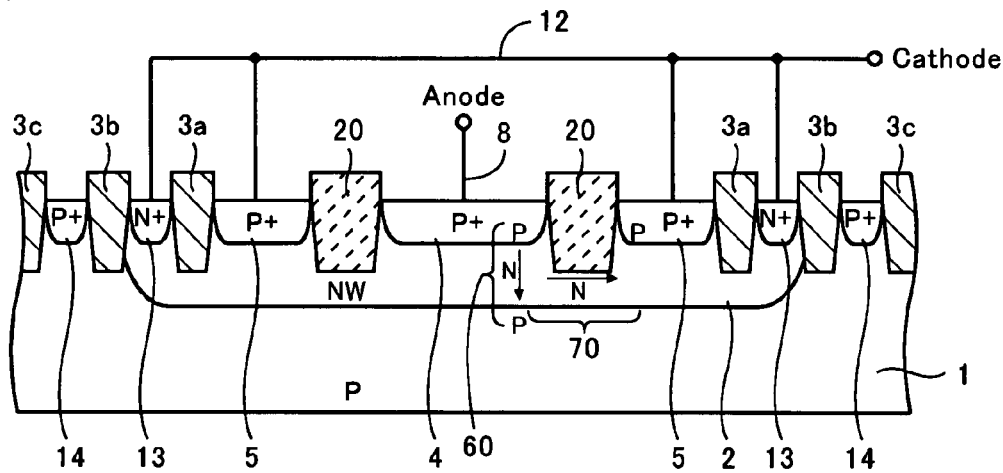
FIG. 7 is a cross-sectional view for explaining the semiconductor device of the second embodiment of the invention.

Next, a second embodiment of the invention will be described referring to figures. FIG. 6 is a plan view showing a structure of a semiconductor device having a diode element of the second embodiment (hereafter, referred to as a second structure), and FIG. 7 is a cross-sectional view thereof along line Z-Z. The same reference numerals are used for the same components as those of the first embodiment and description thereof will be omitted. Although omitted in the figures, low concentration ion implantation is performed to the first and second P⁺ layers 4 and 5 according to needs in the similar manner to the first embodiment for the P⁻ layers 6 and 7.

While the second embodiment is the same as the first embodiment in the structure provided with the lateral bipolar transistor, the feature of the second embodiment is that the first P⁺ layer 4 and the second P⁺ layer 5 are isolated by an element isolation insulation film 20 and a lateral PNP bipolar transistor 70 is formed through under the element isolation insulation film 20, as shown in FIGS. 6 and 7.

The element isolation insulation film 20 is formed by the LOCOS method or the STI method which are generally known, and the STI method is preferable for forming the insulation film (a trench insulation film) from an aspect of formation of a small isolation width for enhancing the current drive capability of the lateral PNP bipolar transistor. The thickness of the element isolation insulation film 20 is 0.3 μm and the width thereof is 0.3 μm, for example.

The second structure is thus formed with the diode element utilizing the lateral PNP bipolar transistor where the element isolation insulation film 20 is disposed between the first P⁺ layer 4 and the second P⁺ layer 5.

Figure 8:
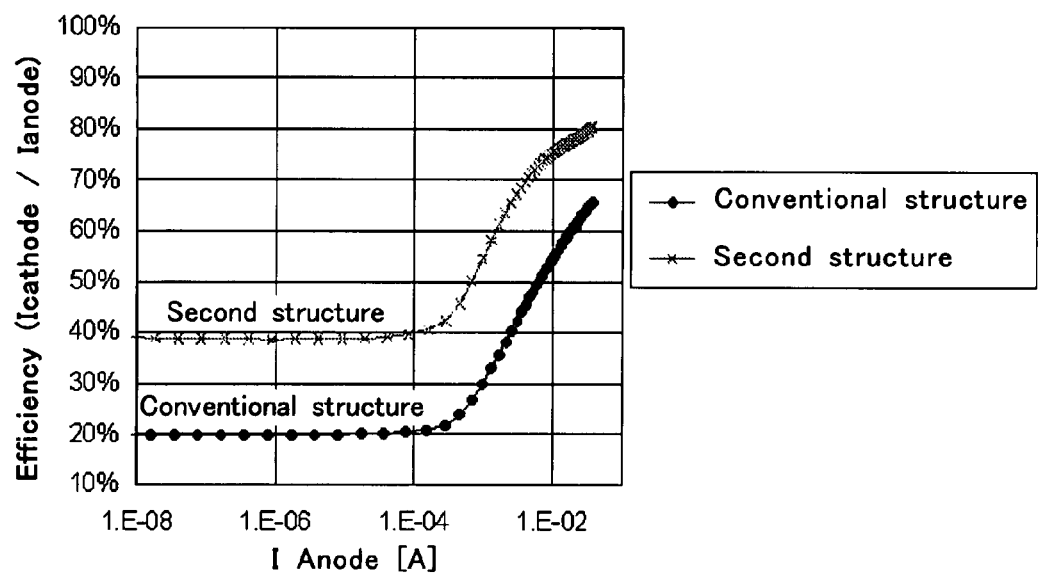
FIG. 8 is a graph showing the current efficiency of the semiconductor device of the second embodiment of the invention.

Next, the current efficiency of the second structure will be described with concrete examples. In FIG. 8, a line connecting cross (×) plots shows the current efficiencies of the second structure where the width of the element isolation insulation film 20 is 0.3 μm when respective anode input currents are flowed therethrough. A line connecting circle (●) plots shows the current efficiencies of the conventional structure shown in FIGS. 10 and 11.

As apparent from this graph, the current efficiencies of the second structure are higher than those of the conventional structure by a percentage of about 20 in all the measured range (the anode input currents of $1\times10^{-8}$ to $1\times10^{-1}$[A]).

As shown in FIG. 8, as the anode input current is increased in the second structure, the current efficiency gradually increases from the anode input current of $1\times10^{-4}$[A]. In the conventional structure, the current efficiency gradually increases in the range of the anode input current more than $1\times10^{-4}$[A]. Although the concrete mechanism of these phenomena is not apparent, it is presumed that the current efficiency of the second structure is higher than that of the conventional structure even in the range more than $1\times10^{-1}$[A].

Since the element isolation insulation film 20 is formed between the first P⁺ layer 4 and the second P⁺ layer 5 in the second structure, the second structure has the more enhanced effect on a breakdown voltage than the first structure. Therefore, when a voltage more than the breakdown voltage of the gate insulation film 9 shown in FIG. 2 is to be applied to the anode (the first P⁺ layer 4) side, the second structure is preferable to use.

By providing the lateral bipolar transistor in the manner of the first and second embodiments, the parasitic current due to the vertical parasitic bipolar transistor is reduced and the forward current capability is enhanced. Therefore, with this semiconductor device, low current consumption is realized and an integrated circuit having desired characteristics is realized.

It is needless to say that the invention is not limited to the above embodiments and includes the modification within the scope of the meanings.

Figure 9:
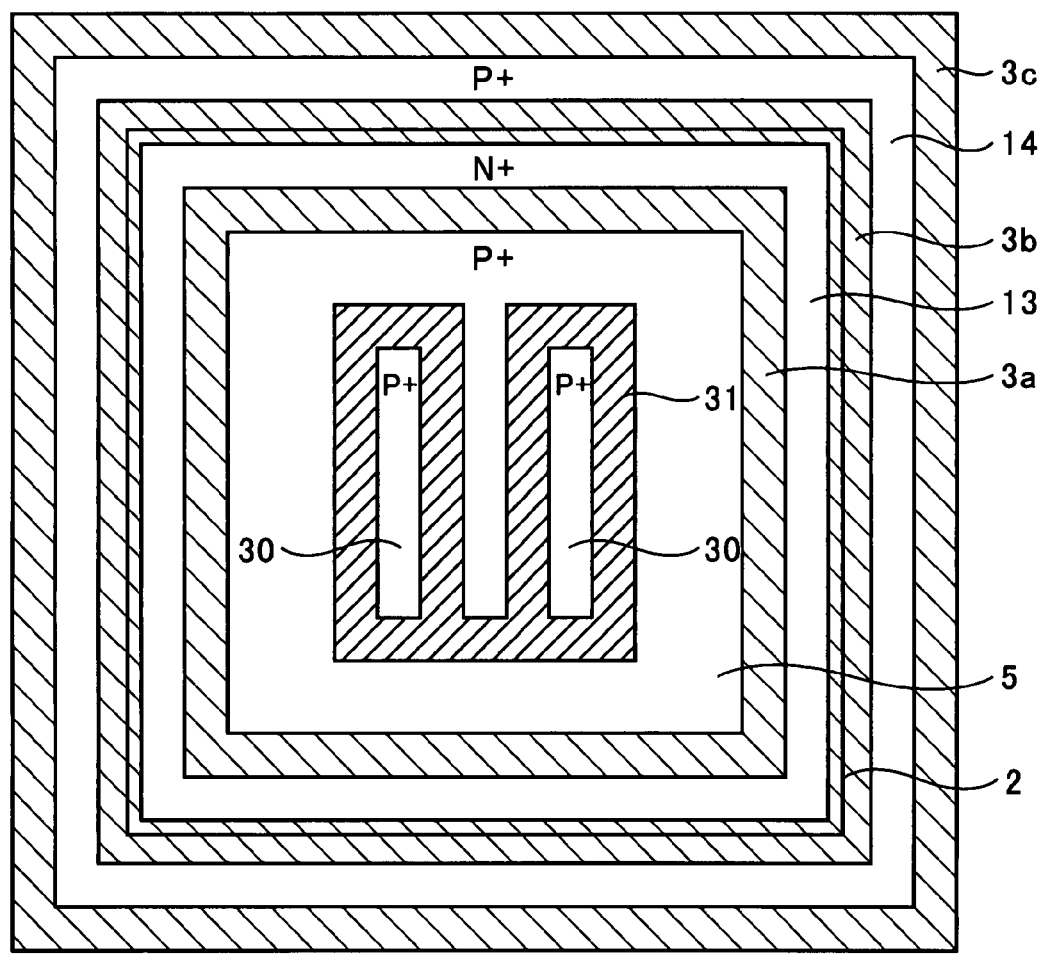
FIG. 9 is a plan view for explaining a semiconductor device of the other embodiment of the invention.

For example, while the first P⁺ layer 4 is formed like an island on the N well layer 2 in the above embodiments, the first P⁺ layer 4 may be formed like two islands (first P⁺ layers 30) and an electrode layer 31 may be formed so as to surround each of the first P⁺ layers 30 as shown in FIG. 9, and various designs are possible. While the sidewall 11 is provided to form the LDD structure in the first embodiment, the sidewall 11 or the LDD structure is not necessarily formed depending on the other elements formed on the same semiconductor substrate. Furthermore, the semiconductor device made of the P-type semiconductor substrate is described in the described embodiments, the invention may be applied to a semiconductor device made of an N-type semiconductor substrate.

The semiconductor device of the invention has the structure provided with the lateral bipolar transistor. This structure reduces the current flowing into the substrate side due to the vertical parasitic bipolar transistor and prominently enhances the current efficiency from the anode to the cathode.

What is claimed is:

1. A semiconductor device comprising a diode element on a semiconductor substrate, the device comprising:
   a semiconductor substrate;
   a well layer of a first general conductivity type formed in the substrate and connected with a cathode electrode of the diode element;
   a first impurity layer of a second general conductivity type formed in the well layer and connected with an anode electrode of the diode element;
   a second impurity layer of the second general conductivity type formed in the well layer and connected with the cathode electrode of the diode element, the second impurity layer being separated from the first impurity layer;
   an electrode layer disposed on the well layer between the first impurity layer and the second impurity layer; and
   an insulation film interposed between the well layer and the electrode layer,
   wherein the first impurity layer, the well layer and the second impurity layer are configured to form a lateral bipolar transistor,
   the first impurity layer comprises a first island portion and a second island portion, and
   the electrode layer surrounds the first and second island portions of the first impurity layer completely in plan view of the semiconductor device.

2. The semiconductor device of claim 1, wherein the electrode layer is connected with the cathode electrode.

3. The semiconductor device of claim 1, wherein the electrode layer is connected with the anode electrode.

4. The semiconductor device of claim 1, further comprising a third impurity layer of the first general conductivity type formed in the well layer and connected with the cathode electrode.

5. The semiconductor device of claim 1, wherein the well layer comprises a retrograde type well layer.

6. The semiconductor device of claim 1, further comprising a sidewall spacer disposed on a side surface of the electrode layer and a low concentration impurity layer of the second general conductivity type formed in the well layer so as to be under the sidewall spacer and in contact with the first impurity layer or the second impurity layer.

7. The semiconductor device of claim 1, wherein part of the electrode layer is disposed between the first and second island portions in the plan view of the semiconductor device.

8. The semiconductor device of claim 7, wherein, in the plan view of the semiconductor device, the first and second island portions are elongated in a first direction, said part of the electrode layer is elongated in the first direction between the first and second island portions, and part of the second impurity layer is elongated in the first direction between the first and second island portions.

* * * * *